(12) United States Patent
Verma et al.

(10) Patent No.: US 7,410,874 B2
(45) Date of Patent: Aug. 12, 2008

(54) METHOD OF INTEGRATING TRIPLE GATE OXIDE THICKNESS

(75) Inventors: Purakh Raj Verma, Singapore (SG); Sanford Chu, Singapore (SG); Hwee Ngoh Chua, Singapore (SG)

(73) Assignee: Chartered Semiconductor Manufacturing, Ltd., Singapore (SG)

( * ) Notice: Subject to any disclaimer, the term of this patent is extended or adjusted under 35 U.S.C. 154(b) by 102 days.

(21) Appl. No.: 11/481,213

(22) Filed: Jul. 5, 2006

(65) Prior Publication Data

US 2008/0124872 A1    May 29, 2008

(51) Int. Cl.
*H01L 21/77*  (2006.01)
(52) U.S. Cl. .............................. 438/275; 257/E21.598
(58) Field of Classification Search .................. 438/199, 438/197, 200, 258, 275, 279, 283, 294; 257/E21.625, 257/E21.639, E27.099, E29.13, E29.137, 257/E51.005
See application file for complete search history.

(56) References Cited

U.S. PATENT DOCUMENTS

| 6,147,008 | A  | 11/2000 | Chwa et al. |
| 6,268,251 | B1 | 7/2001  | Zheng et al. |
| 6,541,321 | B1 | 4/2003  | Buller et al. |
| 6,620,679 | B1 | 9/2003  | Tzeng et al. |

*Primary Examiner*—Matthew S. Smith
*Assistant Examiner*—Walter H Swanson
(74) *Attorney, Agent, or Firm*—Horizon IP Pte Ltd

(57) ABSTRACT

A method for forming TGO structures includes providing a substrate containing regions of first, second and third kinds in which devices with respective first, second and third gate oxide layers of different thicknesses are to be formed. The second gate oxide layer is formed over the substrate and then removed from regions of the first kind where the first gate oxide layer is subsequently grown. A first conductive layer is deposited over the substrate. The first conductive layer and second gate oxide layer are subsequently removed from regions of the third kind. The third gate oxide layer followed by deposition of a second conductive layer is formed over the substrate and then removed except from over regions of the third kind.

18 Claims, 4 Drawing Sheets

METHOD OF INTEGRATING TRIPLE GATE OXIDE THICKNESS

FIELD OF THE INVENTION

The present invention relates generally to method of manufacturing integrated circuits and in particular to methods of manufacturing field effect transistors (FET) of different gate oxide thicknesses on the same chip.

BACKGROUND OF THE INVENTION

The miniaturization of electronic components has made it increasingly common to integrate devices with diverse characteristics on a single integrated circuit (IC) giving rise to what is known as a system on chip (SOC) technology. The various types of devices located on a system on chip IC typically have different operating voltages thus requiring multiple gate oxide layers of different thickness to be formed. For example, a chip may have low, medium and high voltage device regions with the gate oxide associated with the field effect transistors (FET) in the high voltage region being the thickest and the gate oxide associated with the FETs in the low voltage device region being the thinnest. Chips having FETs formed as such are referred to as triple gate oxide (TGO) chips.

In order to form three different gate oxide thicknesses on the respective device regions of a TGO chip, several oxide removal and growth steps have to be carried out. However, the oxide removal processes have a detrimental impact on the shallow trench isolation (STI) structures which are commonly used as a means of isolation between adjacent FETs. For example, referring to FIG. 1 which depicts a portion of a TGO chip, a STI structure 2 is shown sandwiched between two active semiconductor regions 3 and 4. The STI structure 2 is made up of a trench 5 formed in a substrate and filled with trench oxide 6. The peripheral edges of the trench oxide 6 are recessed below the top surface of the trench oxide giving rise to what are known as divots 8. These divots 8 are formed at the edges of the STI during oxide removal as the trench oxide etch rate is higher at the peripheral edges.

The divots 8 in the STI structures 2 are undesirable as they increase the sub-threshold leakage current of transistors in the adjacent active semiconductor regions 3, 4. This effect is particularly significant for the low voltage regions with thin gate oxide transistors. Therefore, it is desirable to provide a method for fabricating a TGO chip in which divot formation in the STI structures is reduced.

SUMMARY OF THE INVENTION

The present invention aims to provide a method of forming TGO chips which reduces the extent of divot formation in STI structures.

In accordance with a first aspect of the invention, there is provided a method for forming TGO chips comprising providing a substrate comprising regions of a first kind, regions of a second kind, regions of a third kind, internal isolation regions which separate devices within each region and bounding isolation regions which separate devices of different regions. Regions of the first kind are semiconductor regions over which devices with thin gate oxide are formed and comprise the internal isolation regions and portions of the bounding isolation regions. Regions of the second kind are semiconductor regions over which devices with gate oxides of intermediate thickness are formed and comprise internal isolation regions and portions of bounding isolation region. Finally, regions of the third kind are semiconductor regions over which devices with thick gate oxide are formed and they also comprise internal isolation regions and portions of bounding isolation regions;

An intermediate thickness gate oxide layer is formed over regions of the first kind, second kind and third kind, removed from regions of the first kind where a thin gate oxide layer is grown. A first conductive layer is deposited over all the regions. The first conductive layer and intermediate thickness gate oxide layer are removed from regions of the third kind. A thick gate oxide layer is formed overall the regions followed by the deposition of an overlying second conductive layer. The thick gate oxide layer and second conductive layer are then removed except from over regions of the third kind after which a third conductive layer is deposited. Fabrication of the devices is completed using standard procedures.

In the present invention, the extent of divot formation is advantageously reduced without introducing excessive complexity in the manufacturing process. By reducing the extent of divot formation, subthreshold leakage particularly in the low voltage area is reduced.

BRIEF DESCRIPTION OF THE DRAWINGS

In the accompanying drawing forming a material part of this description, there is shown.

DETAILED DESCRIPTION OF THE PREFERRED EMBODIMENTS

Figure 1:
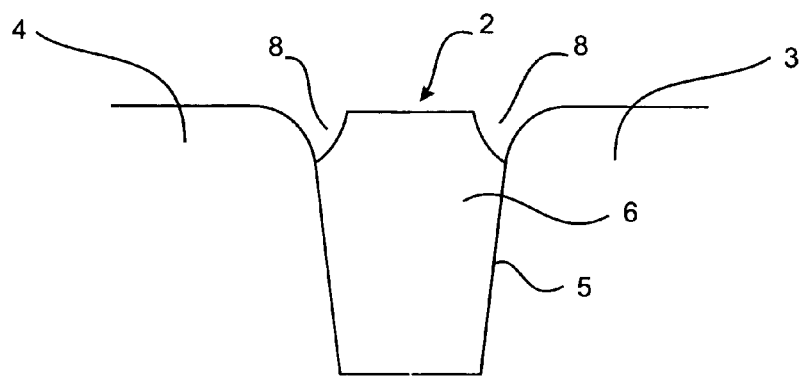
FIG. 1 shows divots formed in STI trenches of TGO chips fabricated using conventional processing methods.
Figure 2:
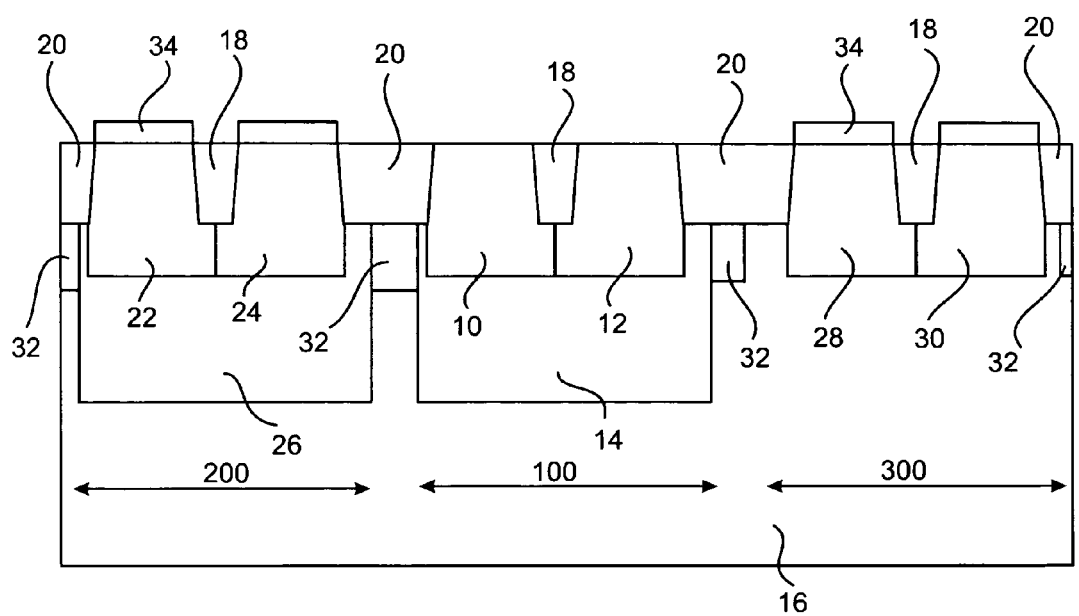
FIGS. 2-7 are cross-sectional views showing a method for forming TGO chips according to one embodiment of the present invention.

Preferred embodiments of the invention are described with the aid of FIGS. 2-7 which are various cross-sections of a TGO chip at an intermediate stage of manufacture. In TGO structures there are semiconductor regions of the first kind, for example a low voltage region over which devices with thin gate oxide are formed, semiconductor regions of the second kind, for example an intermediate voltage region over which devices with gate oxides of intermediate thickness are formed and semiconductor regions of the third kind for example, a high voltage region over which devices with thick gate oxide are formed. Correspondingly, there is a low threshold voltage for MOSFET in semiconductor regions of the first kind, an intermediate threshold voltage for MOSFET in semiconductor regions of the second kind and a high threshold voltage for MOSFET in semiconductor regions of the third kind.

With reference to FIGS. 2-7, in the semiconductor regions of the first kind 100, that is regions over which a thin gate oxide is formed, there is an n-well 10 and a p-well 12, which are formed in a deep n-well 14 that is formed in a p-substrate 16. An isolation region, 18, which preferably is an STI region, separates the n-well from the p-well. This depicts examples of what could constitute semiconductor regions of the first kind, which could contain any number of n-type or p-type semiconductor regions. The semiconductor regions can be any kind of semiconductor region and not necessarily wells. The semiconductor regions need not be formed in a deep n-well that is formed in a p-substrate, but could for example be formed in a deep p-well that is formed in an n-substrate. Similarly, in FIGS. 2-7, in the semiconductor regions of the second kind 200, that is regions over which a gate oxide of intermediate thickness is formed, there is an n-well 22 and a p-well 24, which are formed in a deep n-well 26 that is formed in a p-substrate 16. An isolation region, 18, which preferably is an STI region, separates the n-well from the p-well. This depicts examples of what could constitute semiconductor regions of the second kind, which could contain any number of n-type or p-type semiconductor regions. The semiconductor regions can be any kind of semiconductor region and not necessarily wells. The semiconductor regions need not be formed in a deep n-well that is formed in a p-substrate, but could for example be formed in a deep p-well that is formed in an n-substrate. In the same way, in FIGS. 2-7 semiconductor regions of the third kind 300, that is regions over which a thick gate oxide is formed, are an n-well 28 and a p-well 30, which are formed in a p-substrate 16. An isolation region, 18, which preferably is an STI region, separates the n-well from the p-well. This depicts examples of what could constitute semiconductor regions of the third kind, which could contain any number of n-type or p-type semiconductor regions. The semiconductor regions can be any kind of semiconductor region and not necessarily wells and they could be formed in an n-substrate. Isolation regions separate regions of different kinds. Preferably these isolation regions are STI isolation regions 20 that are disposed over field implant regions 32, which are added in this case to enhance the isolation.

Once a substrate containing semiconductor regions of the first 100, second 200 and third 300 kind are provided, then, according to preferred embodiments of the process of the invention, an intermediate thickness thermal gate oxide 34 is grown over all the semiconductor regions. In one embodiment, the thickness of the intermediate thickness gate oxide could be about 120 Angstroms, which corresponds to an operating voltage of about 5 volts for a device having both a PMOS FET of which n-well 22 would be a constituent or an NMOS FET of which p-well 24 would be a constituent. Next comes a first masking step that exposes semiconductor regions of the first kind 100, STI regions 18 separating semiconductor regions of the first kind and portions of STI regions 20 that separate semiconductor regions of the first kind from semiconductor regions of the second and third kind. This masking step is followed by an etching step that removes the intermediate thickness gate oxide only from over semiconductor regions of the first kind 100. This oxide etching step of the intermediate thickness gate oxide, which by itself is insufficient to cause discernable damage, is the only oxide etching step to which the semiconductor regions of the first kind and adjoining STI regions are subjected. Preferably, forming a photoresist layer and patterning the photoresist layer to expose only semiconductor regions of the first kind can accomplish the masking. After etching, the photoresist layer is removed. The preceding steps give rise to the structure shown in FIG. 2.

Figure 3:
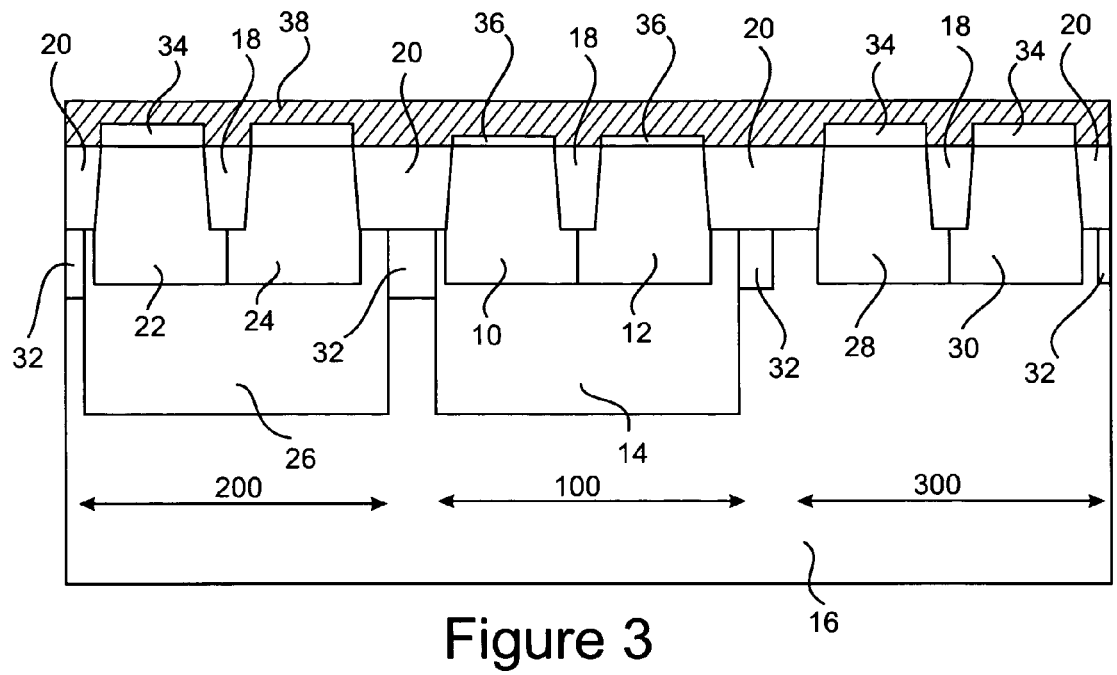
Figure 4:
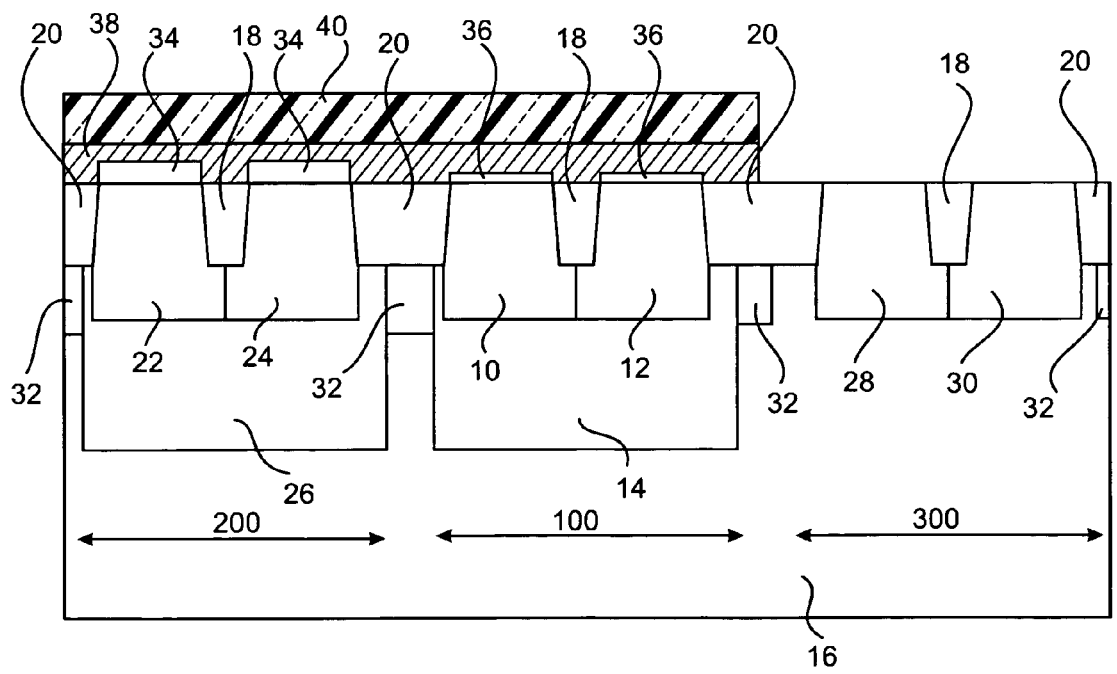

A thin thermal gate oxide 36 is now grown over the exposed semiconductor regions of the first kind. In one embodiment, the thickness of the thin gate oxide could be about 30 Angstroms, which corresponds to a low operating voltage of about 1.8 volts for a device including both a PMOS FET of which n-well 10 would be a constituent or an NMOS FET of which p-well 12 would be a constituent. The gate oxide growth over the semiconductor regions of the second and third kind is negligible during the thin gate oxide growth process since they are already covered by the intermediate gate oxide 34. As shown in FIG. 3, a first conductive layer 38 is then deposited over all the semiconductor regions. In one embodiment, the first conductive layer 38 is a polysilicon layer. The first conductive layer 38 may have a thickness of about 600 Angstroms.

A second masking step is then performed to expose only the semiconductor regions of the third kind 300, STI regions 18 separating semiconductor regions of the third kind and portions of STI regions 20 that separate semiconductor regions of the third kind 300 from semiconductor regions of the first 100 and second 200 kind. In one embodiment, the masking step is performed by forming a photoresist layer 40 and patterning the photoresist layer to expose only semiconductor regions of the third kind, STI regions 18 separating semiconductor regions of the third kind and portions of STI regions 20 that separate semiconductor regions of the third kind from semiconductor regions of the first and second kind can accomplish the masking. Etching steps follow to remove the first conductive layer 38 from over semiconductor regions of the third kind 300 and adjoining STI regions and to dip off the intermediate thickness gate oxide layer from over semiconductor regions of the third kind. This oxide etching step of the intermediate thickness gate oxide, which by itself is insufficient to cause discernable damage, is the only oxide etching step to which the semiconductor regions of the third kind and adjoining STI regions are subjected. The preceding steps give rise to the structure shown in FIG. 4.

Figure 5:
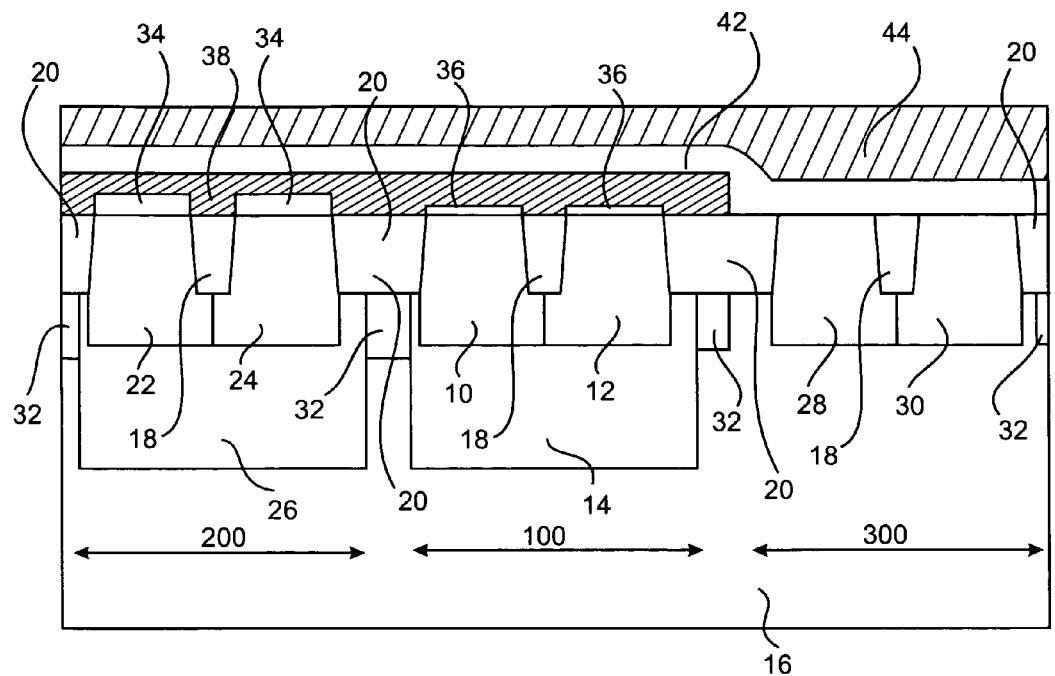

After the above mentioned etching steps the photoresist layer 40 is removed and a thick gate oxide layer 42 is formed. In a preferred embodiment, the thick gate oxide, which is appropriate for high voltage metal oxide semiconductor field effect transistors (MOSFET), is formed by first growing a thin layer of thermal oxide over the exposed semiconductor regions of the third kind 300, followed by the deposition of an overlying layer of HTO by a chemical vapour deposition process. A low temperature $N_2$ anneal is then performed. The thickness of the thick gate oxide could be around 300 to 1000 Angstroms, which corresponds to a high operating voltage between 20 to 70 volts for a device including both a PMOS FET of which n-well 28 would be a constituent or an NMOS FET of which p-well 30 would be a constituent. As shown in FIG. 5, a second conductive layer 44 is then deposited over all the regions. In a preferred embodiment, the second conductive layer 44 is a polysilicon layer. The second conductive layer may have a thickness of about 600 Angstroms.

A third masking step is now performed that is the complement of the second masking step so that what was exposed in the second masking step is now masked and what was masked in the second masking step is now exposed. Thus in the third masking step the only regions masked are the semiconductor regions of the third kind 300, STI regions 18 separating semiconductor regions of the third kind and portions of STI regions 20 that separate semiconductor regions of the third kind 300 from semiconductor regions of the first 100 and second kind 200. In one embodiment, this is implemented by forming a photoresist layer 46 and patterning the photoresist layer to mask only semiconductor regions of the third kind, STI regions 18 separating semiconductor regions of the third kind and portions of STI regions 20 that separate semiconductor regions of the third kind from semiconductor regions of the first and second kind can accomplish the masking. Etching steps follow to remove the second conductive layer 44 from over semiconductor regions of the first 100 and second 200 kinds and adjoining STI regions and to dip off the thick oxide layer that is disposed over the remaining first conductive layer 38. At this stage in the process the structure is as shown in FIG. 6.

Figure 6:
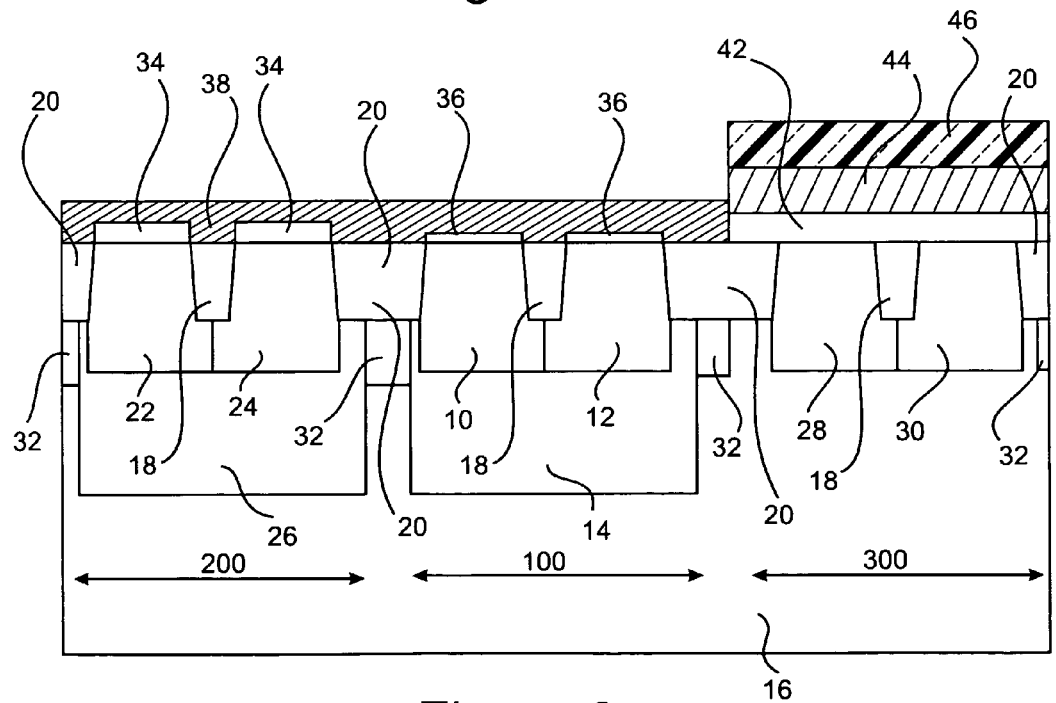
Figure 7:
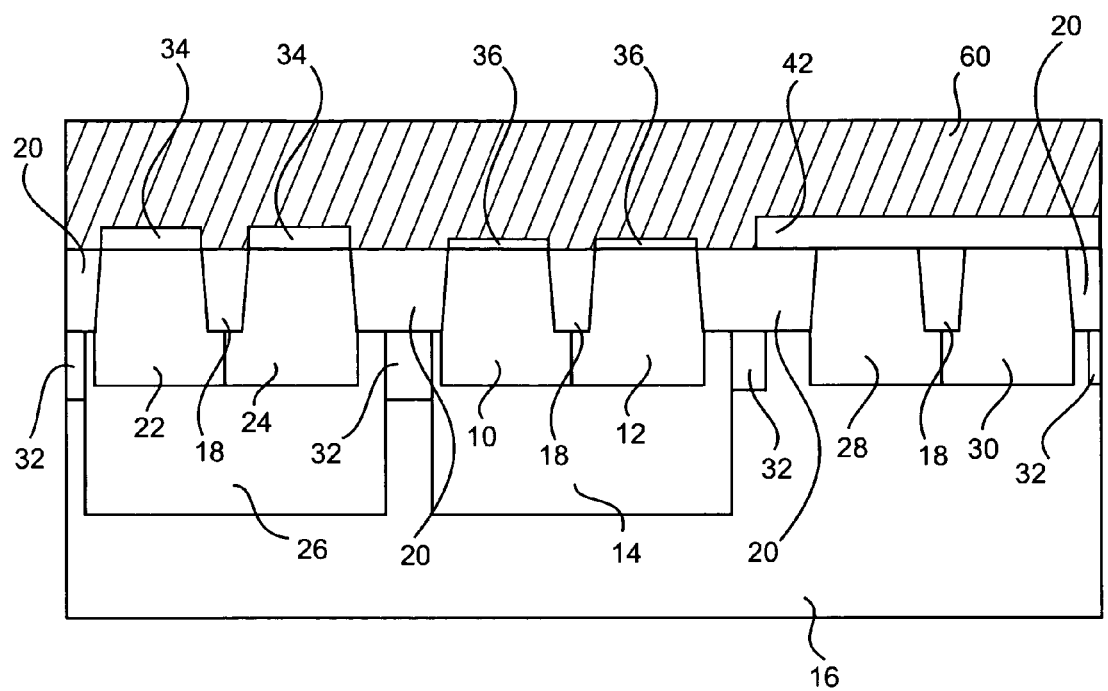

Referring now to FIG. 7, there is shown the structure of FIG. 6 having a third conductive layer disposed over the remaining first conductive layer 38 and remaining second conductive layer 44. The third conductive layer is deposited to increase the conductance of the gates. Preferably the third conductive layer is a polysilicon layer and deposited to a depth of about 1400 Angstroms, so that the combined conductive layer which is a composite of the third conductive layer with either the first 38 or second 44 conductive layer preferably has a thickness of about 2000 Angstroms.

In the succeeding steps that follow the combined layer 60 is patterned to define amongst others the gates for the transistors in the various semiconductor regions and subsequent processing to complete the TGO structures is accomplished using standard CMOS processing procedures.

While the invention has been particularly shown and described with reference to the preferred embodiments thereof, it will be understood by those skilled in the art that various changes in form and detail may be made without departing from the spirit and scope of the invention.

The invention claimed is:

1. A method of forming triple gate oxide (TGO) structures comprising:
   providing a substrate comprising regions of a first kind, regions of a second kind, regions of a third kind, internal isolation regions which separate devices within each region and bounding isolation regions which separate devices of different regions;
   wherein regions of the first kind are semiconductor regions over which devices with a first gate oxide layer are formed, said regions of the first kind comprising the internal isolation regions and the portions of the bounding isolation regions; regions of the second kind are semiconductor regions over which devices with a second gate oxides layer are formed, said regions of the second kind comprising the internal isolation regions and the portions of bounding isolation regions; and regions of the third kind are semiconductor regions over which devices with a third gate oxide layer are formed, said regions of the third kind comprising the internal isolation regions and the portions of bounding isolation regions;
   forming a second gate oxide layer over said regions of the first, second and the third kind;
   removing said second gate oxide layer from said regions of the first kind;
   forming a first gate oxide layer over said regions of the first kind;
   forming a first conductive layer over said regions of the first, second and the third kind;
   removing said first conductive layer and said second gate oxide layer from said regions of the third kind;
   forming a third gate oxide layer;
   forming a second conductive layer over said regions of the first kind, said regions of the second kind and said regions of the third kind;
   removing said second conductive layer and said third gate oxide layer from said regions of the first kind and said regions of the second kind;
   forming a third conductive layer over said regions of the first kind, said regions of the second kind and said regions of the third kind;
   completing fabrication of devices in said regions of the first kind, said regions of the second kind and said regions of the third kind according to standard manufacturing procedures
   wherein the first, second and third gate oxide layers have different thickness, the first gate oxide layer being the thickest and the third gate oxide layer being the thinnest.

2. The method of claim 1 wherein forming said third gate oxide layer comprises forming a thermal oxide over said regions of the third kind followed by depositing an overlying HTO layer over said regions of the first kind, said regions of the second kind and said regions of the third kind.

3. The method of claim 1 wherein said substrate is an n-type or p-type silicon substrate.

4. The method of claim 1 wherein said semiconductor regions are n-type or p-type silicon regions.

5. The method of claim 1 wherein said devices are NMOS ore PMOS FET devices.

6. The method of claim 1 wherein said first gate oxide layer is a silicon gate oxide layer about 30 Angstroms thick.

7. The method of claim 1 wherein said second gate oxide layer is a silicon gate oxide layer about 120 Angstroms thick.

8. The method of claim 1 wherein said third gate oxide layer is a silicon gate oxide layer between about 300 to 1000 Angstroms thick.

9. The method of claim 1 wherein said internal isolation regions are STI isolation regions.

10. The method of claim 1 wherein said bounding isolation regions are STI isolation regions disposed over field implant isolation regions.

11. The method of claim 1 wherein said second gate oxide layer is formed by thermal oxidation.

12. The method of claim 1 wherein said removal of said second gate oxide layer is performed by forming a photoresist layer, patterning the photoresist layer to expose only regions of the first kind, etching said second gate oxide layer and removing said photoresist layer.

13. The method of claim 1 wherein said first gate oxide layer is formed by thermal oxidation.

14. The method of claim 1 wherein said first conductive layer is formed by deposition of polysilicon.

15. The method of claim 1 wherein said removal of said first conductive layer and said second gate oxide layer from said regions of the third kind is performed by forming a photoresist layer, patterning the photoresist layer to expose only regions of the third kind, etching said first conductive layer and said second gate oxide layer and removing said photoresist layer.

16. The method of claim 1 wherein said second conductive layer is a polysilicon layer.

17. The method of claim 1 wherein said removal of said second conductive layer and said third gate oxide layer from said regions of the first kind and said regions of the second kind is performed by forming a photoresist layer, patterning the photoresist layer to expose only said regions of the first kind and said regions of the second kind, etching said second conductive layer and said third gate oxide layer and removing said photoresist layer.

18. The method of claim 1 wherein said third conductive layer is formed by deposition of polysilicon.

* * * * *